United States Patent [19]
Yamazaki et al.

[11] Patent Number: 5,780,345
[45] Date of Patent: Jul. 14, 1998

[54] SEMICONDUCTOR DEVICE AND METHOD FOR FORMING THE SAME

[75] Inventors: Shunpei Yamazaki, Tokyo; Yasuhiko Takemura; Norihiko Seo, both of Kanagawa, all of Japan

[73] Assignee: Semiconductor Energy Laboratory Co., Ltd., Kanagawa, Japan

[21] Appl. No.: 609,477

[22] Filed: Mar. 1, 1996

Related U.S. Application Data

[62] Division of Ser. No. 416,473, Apr. 4, 1995, Pat. No. 5,523,605, which is a continuation of Ser. No. 133,788, Oct. 8, 1993, abandoned, which is a continuation of Ser. No. 818,873, Jan. 10, 1992, abandoned.

[30] Foreign Application Priority Data

Jan. 11, 1991 [JP] Japan .......................... 3-69560

[51] Int. Cl.$^6$ .................................................. H01L 21/336
[52] U.S. Cl. ............................................ 438/282; 438/301
[58] Field of Search .......................... 437/30, 40 R, 437/41 R, 44, 45, 38, 203; 438/282, 301

[56] References Cited

U.S. PATENT DOCUMENTS

| | | |
|---|---|---|
| 4,095,251 | 6/1978 | Dennard et al. .......................... 437/44 |
| 4,683,645 | 8/1987 | Naguib et al. .......................... 437/41 |
| 4,737,471 | 4/1988 | Shirato et al. .......................... 437/44 |
| 4,956,691 | 9/1990 | Culley et al. .......................... 257/369 |
| 4,997,777 | 3/1991 | Boivin .......................... 437/203 |
| 5,041,855 | 8/1991 | Gaulandris et al. .......................... 357/23.4 |
| 5,124,272 | 6/1992 | Saito et al. .......................... 437/44 |

FOREIGN PATENT DOCUMENTS

| | | | |
|---|---|---|---|
| 1-064262 | 3/1989 | Japan | .......................... 357/23.3 |
| 2-035779 | 2/1990 | Japan | .......................... 357/23.3 |
| 2-228071 | 9/1990 | Japan | .......................... 357/23.3 |

*Primary Examiner*—John Niebling
*Assistant Examiner*—Brian K. Dutton
*Attorney, Agent, or Firm*—Sixbey, Friedman, Leedom & Ferguson; Gerald J. Ferguson, Jr.; Jeffrey L. Costellia

[57] ABSTRACT

There is disclosed a short-channel FET which is excellent in properties and adapted for mass production. FETs of this construction can be packed at a high density. There is also disclosed a method for forming this FET. The semiconductor substrate of this FET has a plateau-shaped portion protruding from the body of the substrate. This plateau-shaped portion is substantially identical in contour with a gate electrode formed over it. The gate electrode is in register with the plateau-shaped portion. With respect to the relation of doped regions of the substrate becoming the source and drain to the channel region, the narrowest portion in the channel region is not in contact with a gate-insulating film.

13 Claims, 5 Drawing Sheets

SEMICONDUCTOR DEVICE AND METHOD FOR FORMING THE SAME

This is a Divisional application of Ser. No. 08/416,473, filed Apr. 4, 1995; now U.S. Pat. No. 5,523,605 which itself was a continuation of Ser. No. 08/133,788,filed Oct. 8, 1993, now abandoned; which itself is a continuation of application Ser. No. 07/818,873, filed Jan. 10, 1992, now abandoned.

FIELD OF THE INVENTION

The present invention relates to a microelectronic semiconductor device and also to a semiconductor integrated circuit utilizing such semiconductor devices.

BACKGROUND OF THE INVENTION

MOSFETs (metal oxide semiconductor FETs) and MISFETs (metal-insulator semiconductor FETs) are devices essential to fabrication of semiconductor integrated circuits (ICs), large scale integrated circuits (LSIs), and very-large-scale integrated circuits (VLSIs). These MOSFETs and MISFETs are collectively referred to as MISFETs herein. Devices having increasingly smaller dimensions and devices having increasingly higher speeds of operation have been manufactured. With these trends, MISFETs have been improved and varied.

The MISFET which is considered to be in the most advanced stage is a lightly doped drain (LDD) MISFET. The structure of this device is schematically shown in FIG. 1. The feature of the MISFET of this structure is that the concentrations of the doped regions formed on the substrate such as source and drain vary relatively continuously and, therefore, a large electric field is not produced at the boundary between each doped region and the neighboring channel region. For example, in the structure shown in FIG. 1, the conductivity type changes frequently in going from a source electrode 7 to a drain electrode 6 through a first source 2 of $n^+$-type, a second source region 3 of $n^-$-type, a channel region 8 of $p^-$-type, a second drain region 4 of $n^-$-type, and a first drain region 5 of $n^+$-type. For this reason, the electric field set up at the boundary between the channel region and each doped region has a mild gradient. Hence, the carriers are less likely to be accelerated excessively in this region. Consequently, less defects are produced in the semiconductors and in the gate-insulating film. This permits the LDD MISFET to be used for a longer time than is the conventional MISFET.

In the typical LDD MISFET shown in FIG. 1, some problems take place if the device is fabricated in small size. One typical problem is that the doped regions and the gate electrode are overlapped. Another typical problem is the concentration of the electric field between the successive doped regions immediately under the gate-insulating film. The former problem is associated with the process. Usually, each doped region is formed by ion implantation. In particular, dopant ions are implanted into the substrate by a self-aligning process, using the gate electrode as a mask. Ideally, therefore, it is impossible that the gate electrode and the doped regions are overlapped. In practice, however, dopant ions go round and arrive under the gate electrode. It is considered that the main cause for this is that implanted dopant ions are scattered secondarily by the lattices. This effect becomes larger as the energy of the incident ions increases. Also, the effect becomes more conspicuous as the width of the gates decreases, i.e., as the channel length decreases. Owing to the overlap, the parasitic capacitance between the gate electrode and the neighboring doped region increases, and the speed of operation of the MISFET drops.

The typical LDD MISFET shown in FIG. 1 also suffers from the latter problem. Specifically, with the shape of doped region as shown in FIG. 1, if a voltage is applied between the source and drain, the electric field is concentrated at points A and B. The point A is the front end of the second source region. The point B is the front end of the second drain region. Carriers most accelerated run between these two points. Since the points A and B are located immediately under the gate-insulating film, this film is often damaged. Because the gate-insulating film is damaged by the accelerated carriers, the film forms a charge-capturing center. Where the film is damaged severely, it is impossible to control the carries passing through the channel region by the gate electrode. Especially, it is necessary that the gate insulating film be made thinner roughly in proportion to the channel length. A microelectronic MISFET having a channel length less than 0.5 μm has an extremely thin gate insulating film having a thickness as small as tens of nanometers. Consequently, even if defects having dimensions on an atomic scale exist, the characteristics of the MISFET are affected.

An LDD MISFET which has been devised to solve the foregoing problems is shown in FIG. 2(a). This device differs from the device shown in FIG. 1 in that the point A at the front end of the second source region and the point B at the front end of the second drain region are remote from the gate insulating film. Therefore, damage to the gate-insulating film which would otherwise be caused by concentration of the electric field at these two points can be prevented. As can be seen from FIG. 2(a), a considerable distance exists between the electrode and the doped region, although they are overlapped. Hence, the parasitic capacitance is reduced.

The LDD MISFET of this construction is fabricated by implanting dopant ions obliquely. However, where the channel length is less than 0.5 μm, high production yield cannot be maintained because of difficulties with the production. In particular, in order to manufacture MISFETs of this structure with high reproducibility, the energy to which implanted dopant ions are accelerated must be controlled accurately. Also, it is necessary to prepare an ion source emitting ions having homogeneous energy; otherwise, ions implanted obliquely would enter deeper than expected. As a result, neighboring doped regions would be connected to each other, as shown in FIG. 2(b). This tendency becomes more conspicuous as the channel length decreases.

In conclusion, it is industrially difficult to make the channel lengths of the conventional LDD MISFETs including the improved type shown in FIG. 2 less than 0.5 μm, especially less than 0.3 μm. MISFETs having channel lengths less than 0.3 μm are known as quarter micron MISFETs.

SUMMARY OF THE INVENTION

It is an object of the present invention to provide a MISFET which has a short channel length that has been very difficult to achieve by the prior art techniques and which can be put into practical use.

It is another object of the invention to provide a method of industrially mass-producing MISFETs having the features described in the preceding paragraph.

It is a more specific object of the invention to provide a MISFET which has a short channel less than 0.5 μm and in which the aforementioned damage to the gate-insulating film is minimized, and the parasitic capacitance due to overlapping of gate electrode and doped regions is reduced to a minimum.

It is a further object of the invention to provide a method of industrially mass-producing MISFETs of the structure described in the immediately preceding paragraph.

In accordance with the present invention, an insulated gate field-effect transistor is offered which comprises a semiconductor substrate, a plateau-shaped portion protruding from the upper surface of the substrate, and a gate electrode formed over the plateau-shaped portion, the gate electrode being substantially identical in contour with the plateau-shaped portion (or the gate electrode being substantially aligned with the plateau-shaped portion.)

This insulated gate field-effect transistor is fabricated by a method starting with formation of an insulating film on a semiconductor film or substrate. The insulating film will become a gate insulating film. A conductive coating which will become a gate electrode is formed on the insulating film. (The conductive coating comprises a semiconductor film and/or a metallic film.) Then, the insulating film, the conductive coating, and the semiconductor substrate are partially removed to form a plateau-shaped portion of the substrate and a gate electrode over the plateau-shaped portion. The gate electrode is substantially identical in contour with the plateau-shaped portion. Subsequently, using the gate electrode as a mask, regions in which impurity ions (e.g. Group III and Group V elements of the Periodic Table) have been diffused, e.g. source and drain regions, are formed in the substrate.

Other objects and features of the invention will appear in the course of the description thereof which follows.

DETAILED DESCRIPTION OF THE INVENTION

Figure 1:
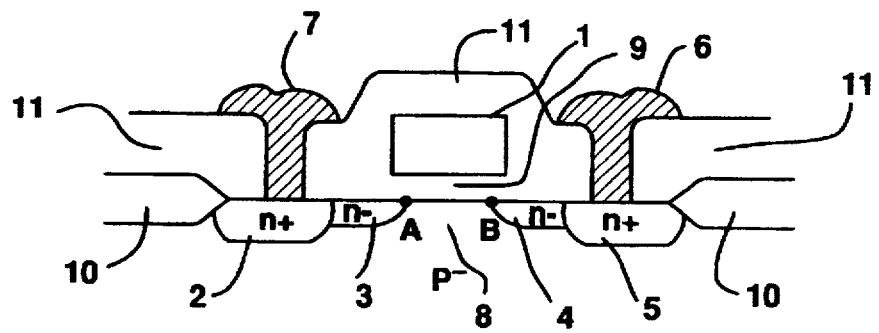
FIG. 1 is a fragmentary vertical cross section of a conventional LDD MISFET.
Figure 2A:
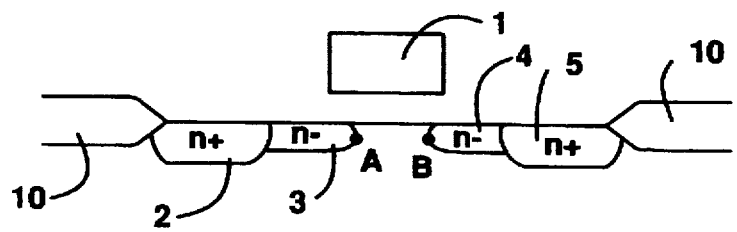
FIG. 2, (a) and (b), are fragmentary vertical cross sections of a conventional LDD MISFET which is an improvement over the FET shown in FIG. 1.
Figure 2B:
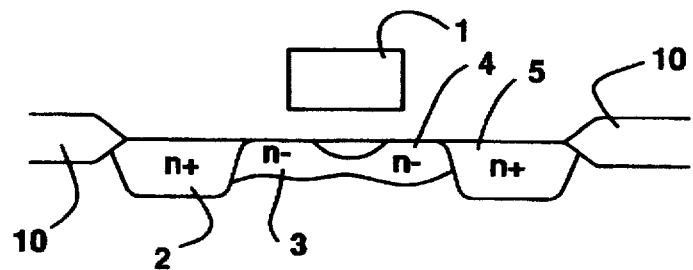
Figure 3:
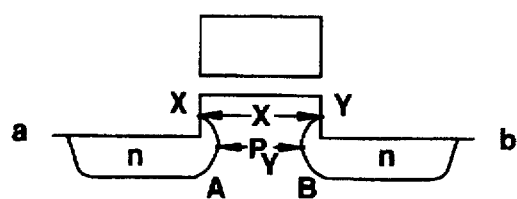
FIG. 3 is a schematic fragmentary vertical cross section of a MISFET according to the invention.

The technical theory underlying the inventive concept for solving the foregoing problems, i.e., reduction in the damage to the gate-insulating film and reduction in the parasitic capacitance, is illustrated in FIG. 3. In particular, a portion of a semiconductor substrate protrudes like a plateau. The protruding plateau-shaped portion is similar in contour with the gate electrode which is formed over the plateau-shaped portion in registry with it. Doped regions, e.g. source and drain regions, are formed in the substrate. Also, a channel region is formed in the substrate under the gate electrode between the doped regions. This FET is characterized in that the narrowest portion in the channel region, i.e., between points A and B, is not in contact with the gate-insulating film located between the channel region and the gate electrode. (That is, source and drain regions are nearest below an interface between the gate insulating film and the substrate.) Especially, with respect to the narrowest portion in the channel region, this portion can be formed substantially flush with the face a–b of the substrate or below this face. In this case, greater advantages are obtained. The interface between the gate insulating film and the substrate is located above the doped regions in FIG. 3.

We can easily estimate from the structure shown in FIG. 3 that the gate-insulating film is protected against carriers accelerated by the concentration of electric field and that the parasitic capacitance due to the overlapping of the gate electrode and the doped regions is reduced.

Figure 4A:
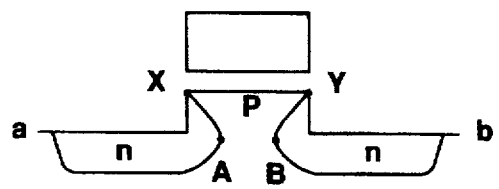
FIG. 4, (a)–(d), are schematic fragmentary vertical cross sections of specific examples of the MISFET shown in FIG. 3.
Figure 4B:
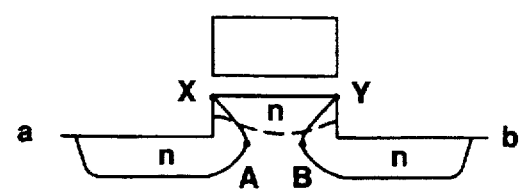
Figure 4C:
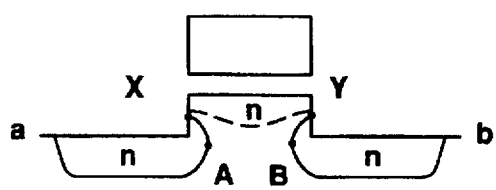

Greater advantages can be had by modifying this fundamental structure. For example, as shown in FIG. 4(a), the upper surfaces X and Y of the protruding portions of the doped region are made exactly or substantially flush with the upper surface of the plateau-shaped portion. This ensures that an inversion layer in the channel region is connected with the doped regions. More specifically, in the structure shown in FIG. 3, if the voltage applied to the underside of the gate electrode is not sufficiently high, application of a voltage to the gate electrode produces an inversion layer as shown in FIG. 4(c). The electrical connection between the inversion layer and the source and the electrical connection between the inversion layer and the drain are not reliable. However, in the structure shown in FIG. 4(a), if the voltage applied to the underside of the gate electrode is not high enough, the inversion layer is connected with the source and drain with certainty as shown in FIG. 4(b).

Figure 4D:
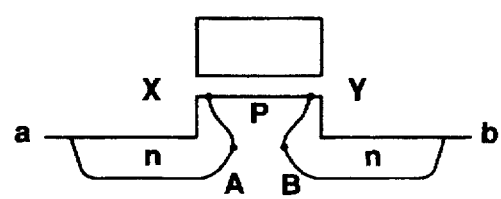

In practice, it is difficult to make the upper surfaces X and Y of the doped regions strictly flush with the upper surface of the protruding plateau-shaped portion. Therefore, the doped regions go to the face of the protruding plateau-shaped portion, and the gate electrode and the doped regions are overlapped, as shown in FIG. 4(d). In this case, however, the area of the overlapped portions is smaller than the area of the overlapped portions produced by the prior art techniques. In addition, the straight line connecting the points A and B at which the electric field is strongest is remote from the gate insulating film and so less defects are created in the gate insulating film by accelerated carriers. Consequently, the novel structure shown in FIG. 4(d) is not inferior in lifetime and speed of operation to the prior art MISFETs though the doped regions undesirably reach the face of the protruding plateau-shaped portion or the doped regions are in contact with the gate insulating film.

Figure 5:
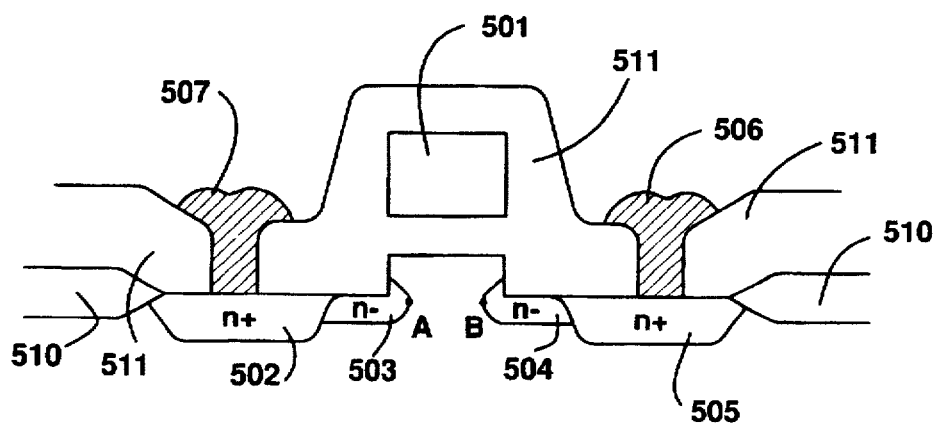
FIG. 5 is a fragmentary vertical cross section of another specific example of the MISFET shown in FIG. 3.

Obviously, the fundamental structure of the invention shown in FIG. 3 or the structure shown in FIG. 4(a) can be combined with the prior art LDD structure to produce a structure as shown in FIG. 5.

Figure 6:
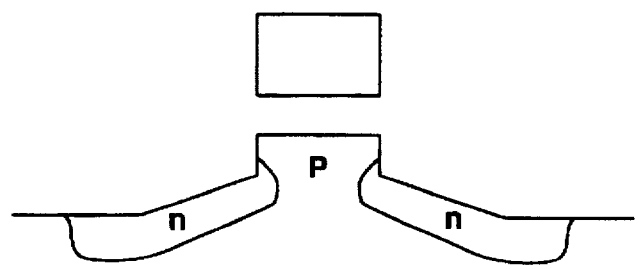
FIG. 6 is a schematic fragmentary vertical cross section of a further specific example of the MISFET shown in FIG. 3.
Figure 7:
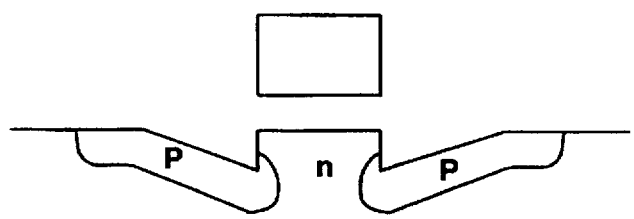
FIG. 7 is a schematic fragmentary vertical cross section of a yet other specific example of the MISFET shown in FIG. 3.
Figure 8:
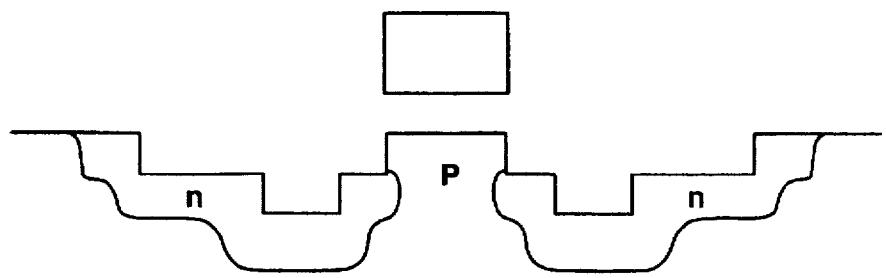
FIG. 8 is a schematic fragmentary vertical cross section of a still other specific example of the MISFET shown in FIG. 3.

Referring to FIGS. 6–8, semiconductor substrates excluding the protruding plateau-shaped portions are inclined or provided with a plurality of steps. It should be understood that these are merely changes in the design and do not constitute departures from the spirit and scope of the invention.

Figure 9A:
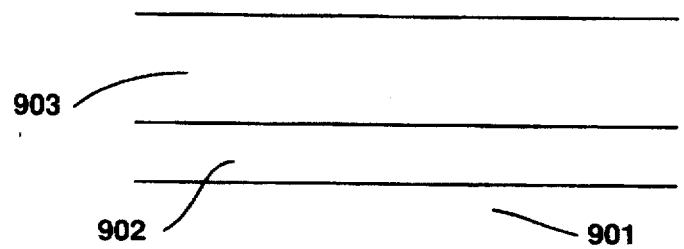
FIG. 9, (a)–(d), are schematic fragmentary vertical cross sections of a MISFET, for illustrating the steps successively performed to fabricate the MISFET by a method according to the present invention.
Figure 9B:
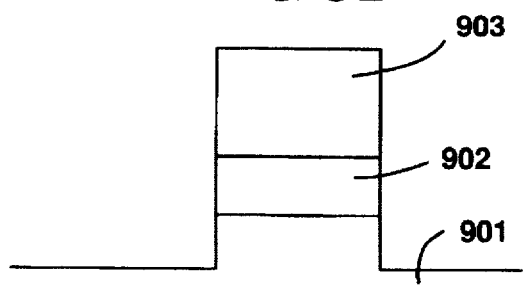

A method of fabricating a MISFET of the above-described structure is next described. As shown in FIG. 9(a), a thin insulating film 902 and a semiconductor coating or a metal coating 903 are formed successively on a semiconductor substrate 901. A portion of the insulating film 902 will function as a gate-insulating film. A portion of the semiconductor coating or metal coating 903 will act as a gate electrode. Therefore, the materials and the thicknesses of these film and coating must be selected according to their applications. Typically, the insulating film 902 is fabricated from silicon oxide, silicon nitride, phosphosilicate glass, boro-phosphosilicate glass, aluminum oxide, diamond, amorphous carbon, a lamination thereof, or a mixture thereof. Typically, the thickness is 2 nm to 100 nm. Typically, the semiconductor coating or metal coating 903 is fabricated from a semiconductor material such as silicon, germanium, or gallium arsenide, a metal such as molybdenum or tungsten, a silicide such as molybdenum silicide or tungsten silicide, or a carbide such as molybdenum carbide or tungsten carbide. Typically, the thickness of the coating 903 is between 10 nm and 10 µm. A different kind of metal coating or semiconductor coating may be formed on the semiconductor coating or metal coating 903.

Then, the semiconductor coating or metal coating 903 and the insulating film 902 are etched away by a well-known anisotropic etching method, except for the portion which will become the gate electrode and the portion which will become the gate insulating film. Also, the semiconductor substrate 901 is partially removed. Typically, the substrate 901 is etched to a depth of 10 nm to 1 µm. This depth is determined, taking account of the subsequent dopant diffusion process, the size of the fabricated MISFET, and other factors. Therefore, the depth is not always restricted to this range. It is necessary that the etching process be carried out vertically to the face of the substrate. That is, the surfaces remaining after the etching process are required to be vertical to the face of the substrate. Two sides of the protruding plateau-shaped portion of the substrate are erected from a surface of the substrate substantially perpendicularly in FIG .9(b).

Figure 9C:
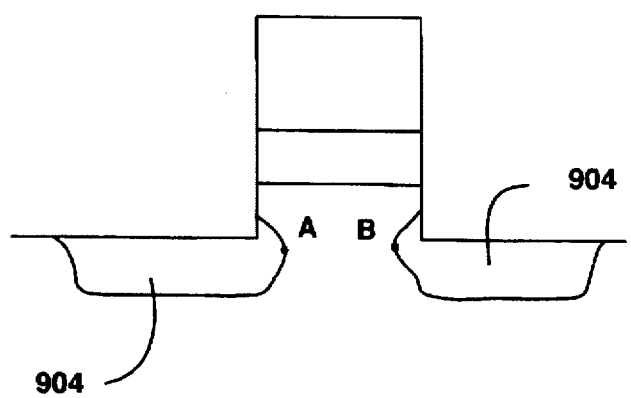

Finally, dopant ions are vertically implanted (injected) into the substrate and the gate electrode formed in this way. In this process, doped regions 904 (e.g. source and drain regions) as shown in FIG. 9(c) are formed by the aforementioned scattering of the dopant ions and for other reasons.

Figure 9D:
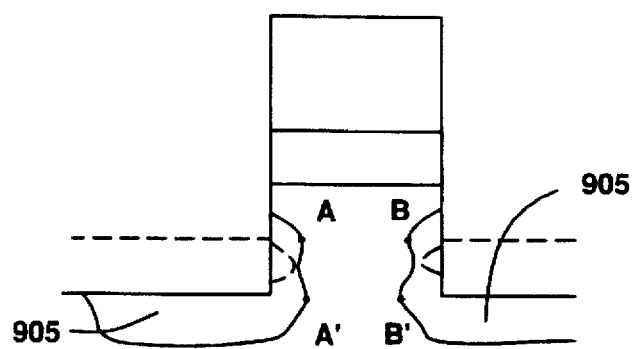

The fundamental structure shown in FIG. 3 can be obtained by these processes. In addition, the structure shown in FIG. 9(d) can be obtained by the following steps. The substrate of the structure shown in FIG. 9(c) is selectively removed again with the gate electrode as a mask by anisotropic etching. Subsequently, doped regions (source and drain regions) are re-formed into a complex shape 905 as shown in FIG. 9(d) by implanting an impurity into the substrate with the gate electrode as a mask.

EXAMPLE 1

Figure 10A:
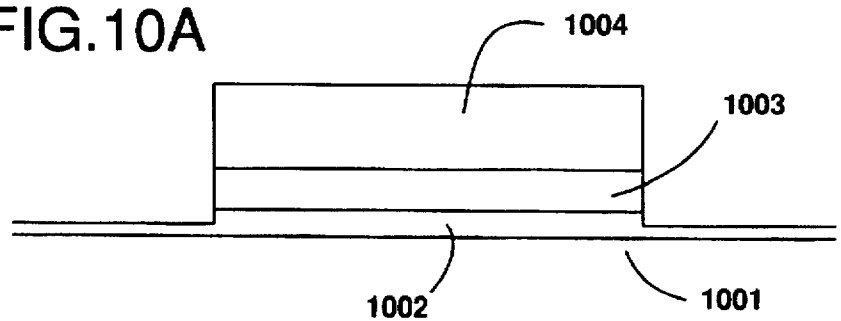
FIG. 10, (a)–(e), are schematic fragmentary vertical cross sections of another MISFET, for illustrating the steps successively performed to fabricate the MISFET by another method according to the invention.

Referring to FIG. 10(a), a film of silicon oxide 1002 having a thickness of 30 nm was formed on the surface of a substrate 1001 of a single crystal of p-type silicon by low pressure CVD. The substrate had <100>orientation and a resistivity of 10 Ω·cm. A film of silicon nitride 1003 having a thickness of 100 nm was formed on the silicon oxide film 1002. A photoresist 1004 was applied to the silicon nitride film 1003 and developed. Then, those portions of the silicon nitride film and of the underlying silicon oxide film which were no longer coated with the photoresist were etched away by a well-known dry etching method. This condition is shown in FIG. 10(a).

Figure 10B:
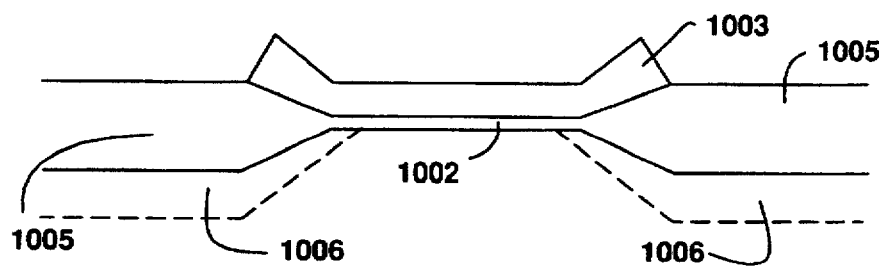

Then, boron ions were implanted into selected portions of the substrate 1001, using the photoresist as a mask, at a dose of about $10^{13}$ atoms/cm$^2$. Thereafter, those portions which were no longer coated with the silicon nitride film were oxidized by wet oxidation to form a thick film of silicon oxide 1005 having a thickness of about 800 nm. The boron ions previously implanted diffused through the substrate, thus forming channel stoppers 1006. This condition is shown in FIG. 10(b)

Figure 10C:
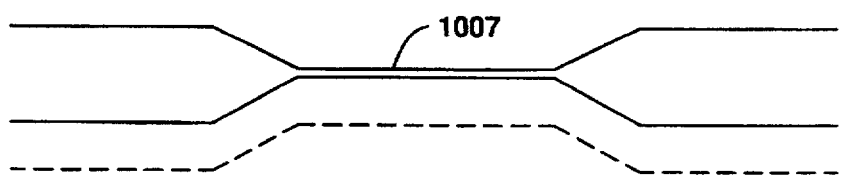

Subsequently, the silicon oxide film 1002 and the silicon nitride film 1003 which had been previously formed were removed to expose the surface of the substrate 1001. A film of silicon oxide 1007 having a thickness of 15 nm was formed on this exposed surface by dry oxidation. Boron ions were shallowly implanted into the substrate through this silicon oxide film at a dose of about $10^{12}$ atoms/cm$^2$. This condition is shown in FIG. 10(c).

Figure 10D:
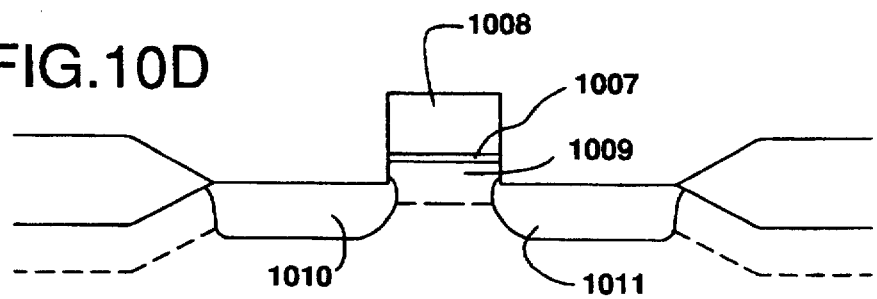

Thereafter, a polysilicon film having a thickness of 300 nm was deposited on the laminate by a well-known low pressure CVD. To improve the electrical conductivity of the polysilicon film, it was doped with phosphorus at about $10^{21}$ atoms/cm$^3$. A photoresist was applied to the polysilicon film. Then, the polysilicon film, the silicon oxide film 1007, and the substrate 1001 were removed selectively by a well-known photolithographic process and a well-known anisotropic etching process. The anisotropic etching process was carried out within a reaction vessel having flat parallel plate electrodes. The substrate was placed on the surface of one flat plate electrode in such a way that the surface to be etched was exposed. Hydrogen gas containing carbon tetrachloride was admitted into the vessel at a pressure of 200 mTorr. An RF power of 13.56 MHz was applied between the electrodes to produce a plasma inside the vessel. At this time, it was necessary to apply a negative voltage to the electrode on which the substrate was placed. In this way, the polysilicon film was etched first, after which the RF power was cut off. The gas inside the vessel was expelled. New hydrogen gas containing carbon tetrafluoride was introduced into the vessel at a pressure of 200 mTorr. The silicon oxide film 1007 was selectively etched by the same method as the method described previously. After the completion of the etching of the silicon oxide film 1007, the gas inside the vessel was driven off. New hydrogen gas containing carbon tetrachloride was introduced into the vessel at a pressure of 200 mTorr. The substrate 1001 was then selectively etched to a depth of 50 nm by the above-described method. By performing these steps, a gate electrode 1008 and an underlying, protruding plateau-shaped portion 1009 were formed on the substrate. At this time, the width of the gate electrode, or the channel length, was 500 nm. This condition is shown in FIG. 10(d). Each of two sides of the protruding portion 1009 and corresponding one of sides of the gate electrode form plane in the structure shown in FIG. 10(d) since the insulating film and the substrate were etched substantially vertically with the gate electrode as a mask.

Figure 10E:
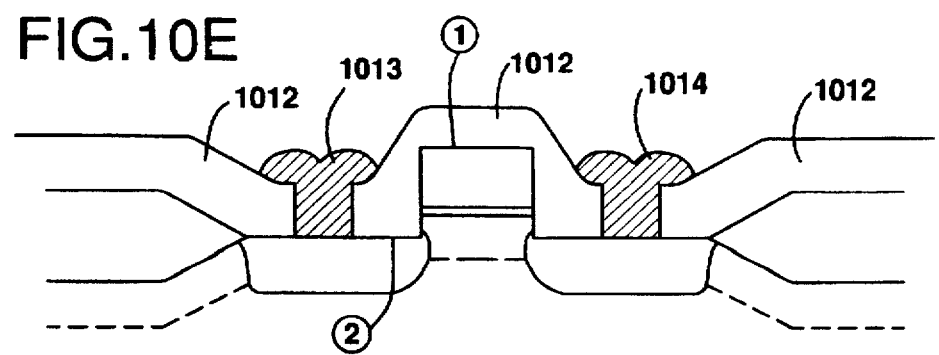

Using the gate electrode 1008 as a mask, arsenic ions were implanted into the substrate at a dose of about $10^{16}$ atoms/cm$^2$. The substrate was annealed at 1000° C. for 60 minutes to thermally diffuse the dopant, thus forming a source 1010 and a drain 1011. Thus, portions of the source and drain were located under the gate electrode, giving rise to the features of the invention. Then, phosphosilicate glass 1012 was deposited as a film of about 500 nm. Finally, holes permitting formation of electrodes were formed in the phosphosilicate glass film by a well-known etching technique. An aluminum film was then formed and selectively removed to form a source electrode 1013 and a drain electrode 1014. This condition is shown in FIG. 10(e). As a result, a MISFET according to the invention was fabricated.

The novel MISFET is comparable or superior to the conventional MISFETs in reliability and lifetime. Of course, the novel MISFET is superior to conventional non-LDD MISFETs in reliability and lifetime. Also, as can be seen from the description of the illustrated embodiment, the manufacturing process is similar to the process for manufacturing conventional non-LDD MISFETs. The number of the used masks is essentially the same. As can be understood from the description made thus far, we believe that the present invention is industrially advantageous.

The foregoing description of preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention in various embodiments and with various modifications as are suited to the particular use contemplated.

What is claimed is:

1. A method for forming an insulated gate field electrode effect transistor comprising the steps of:
   forming an insulating film on a semiconductor substrate;
   forming a conductive film on said insulating film;
   selectively removing a portion of said conductive film, a portion of said insulating film and a portion of said substrate in a direction perpendicular to the substrate in order to form a gate electrode, a gate insulating film and a protrusion of the substrate, respectively, said protrusion being aligned with said gate electrode;
   forming source and drain regions by introducing an impurity into said semiconductor substrate with said gate electrode as a mask, wherein said impurity is introduced in a direction perpendicular to the substrate;
   further removing an additional portion of said substrate with said gate electrode as a mask for further removing after said source and drain regions forming step; and
   re-forming said source and drain regions by introducing a further impurity into said semiconductor substrate with said gate electrode as a mask for introducing said further impurity after said step of removing said additional portion of said substrate,
   wherein said source and drain regions and a channel region formed therebetween are spaced from said gate insulating film.

2. A method according to claim 1 wherein a depth of the portion of said substrate selectively removed is 10 nm to 1 μm.

3. A method according to claim 1 wherein said step of selectively removing said conductive film is carried out to form said gate electrode and subsequently said insulating film and said semiconductor substrate are selectively removed substantially perpendicular with said gate electrode as a mask for selectively removing.

4. A method according to claim 1 wherein said step of selectively removing is carried out by anisotropic etching.

5. A method according to claim 1 wherein said step of further removing said additional portion of said substrate is carried out by anisotropic etching.

6. A method according to 1 wherein said conductive film comprises at least one of a semiconductor film and a metallic film.

7. A method according to claim 1 wherein said conductive film comprises at least one of a semiconductor film and a metallic film.

8. A method according to claim 1 wherein the introduction of said impurity in said step of forming said source and drain regions is carried out by ion implantation.

9. A method according to claim 8 wherein said impurity is injected into said semiconductor substrate in a direction perpendicular to said substrate.

10. A method for producing an insulated gate field effect transistor comprising the steps of:
    forming a protrusion in a substrate, said protrusion extending from a surface of the substrate that is doped with an impurity to provide one conductivity types, wherein an upper surface of the protrusion corresponds to a first level and an upper surface of the substrate to a second level different than the first level;
    forming a gate electrode over the protrusion with a gate insulating film therebetween, said electrode being substantially aligned with the protrusion; and
    introducing an impurity into the substrate with the gate electrode as a mask for introducing said impurity in a direction perpendicular to the substrate in order to form source and drain regions, wherein a channel region is formed in the substrate under the gate insulating film between the source and drain regions,
    wherein an upper portion of the substrate including the channel region is doped with a further impurity of the same conductivity type as the substrate to a level beneath the second level thereby a concentration of the further impurity in the upper portion of the substrate is greater than that in a remainder of the substrate, and
    wherein said channel region and said source and drain regions are spaced from said gate insulating film.

11. A method for producing an insulated gate field effect transistor comprising the steps of:
    forming a protrusion in a substrate;
    forming a gate electrode on the protrusion with a gate insulating film therebetween;
    introducing a first impurity into the substrate with the gate electrode as a mask in a direction perpendicular to the substrate, in order to form source and drain regions in the substrate, wherein a channel region is formed in the substrate under the gate electrode between the source and drain regions,
    wherein opposed face of the source and drain regions are rounded such that there are respective portions of the source and drain regions which are separated from one another by a first distance and other respective uppermost portions of the source and drain regions which are separated from one another by a second distance whereby the first distance is less than the second distance,
    wherein said channel region and said source and drain regions are spaced from said gate insulating film, and
    wherein an upper portion of said channel region is introduced with a second impurity at a dose of about $10^{12}$ atoms/cm$^2$, said second impurity having a same conductivity as the substrate.

12. A method for producing an insulated gate field effect transistor comprising the steps of:
    forming a protrusion at a surface of a substrate;

forming a gate electrode over the protrusion with a gate insulating film therebetween, the gate electrode being substantially aligned with said protrusion;

introducing an impurity into the substrate with the gate electrode as a mask in a direction perpendicular to the substrate, in order to form source and drain semiconductor regions in the substrate, wherein a channel region is formed in the substrate under the gate insulating film between the source and drain regions, wherein the channel region and the source and drain regions are completely spaced from the gate insulating film.

13. A method for producing an insulated gate field effect transistor comprising the steps of:

forming a protrusion in a substrate, said protrusion extending from a surface of the substrate that is doped with a first impurity to provide one conductivity type;

forming a gate electrode over the protrusion with a gate insulating film therebetween; and introducing a second impurity into the substrate with the gate electrode as a mask in a direction perpendicular to the substrate, in order to form source and drain semiconductor regions in the substrate, wherein the source and drain semiconductor regions are completely spaced apart from the gate insulating layer, and a channel region is formed in the substrate completely spaced from and under the gate insulating film between the source and drain regions, wherein an upper portion of the substrate including the channel region is doped with a third impurity of the same conductivity type as said first impurity doped in the substrate at a dose of about $10^{12}$ atoms/cm$^2$, thereby a concentration of the third impurity in the upper portion of the substrate is greater than the concentration of the first impurity in a remainder of the substrate.

* * * * *